United States Patent
Nagel et al.

(10) Patent No.: US 6,791,349 B2
(45) Date of Patent: Sep. 14, 2004

(54) ELECTRICAL COMPONENT WITH A CONTACT AND METHOD FOR FORMING A CONTACT ON A SEMICONDUCTOR MATERIAL

(75) Inventors: Detlef Nagel, Dresden (DE); Reinhart Buhr, Freital (DE); Hanns-Georg Ochsenkühn, Dresden (DE); Jens Paul, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/401,187

(22) Filed: Mar. 27, 2003

(65) Prior Publication Data

US 2003/0184333 A1 Oct. 2, 2003

(30) Foreign Application Priority Data

Mar. 27, 2002 (DE) .......................................... 102 13 609

(51) Int. Cl.⁷ .......................... G01R 31/02; G01R 31/26
(52) U.S. Cl. .......................................... 324/763; 438/18
(58) Field of Search ................................. 324/763, 765, 324/158.1; 438/14–18

(56) References Cited

U.S. PATENT DOCUMENTS

| | | | |
|---|---|---|---|
| 2,672,675 A | 3/1954 | Cross | 409/64 |
| 4,148,400 A | 4/1979 | Cross | 198/345.3 |
| 4,201,284 A | 5/1980 | Brems | 198/345.3 |
| 4,667,804 A | 5/1987 | Dubuit et al. | 198/345.3 |
| 4,674,620 A | 6/1987 | Inoue | 198/345.3 |
| 4,793,261 A | 12/1988 | Schwaemmle | 104/172.3 |
| 6,080,597 A * | 6/2000 | Moon | 438/17 |
| 6,551,916 B2 * | 4/2003 | Lin et al. | 438/612 |

FOREIGN PATENT DOCUMENTS

| | | |
|---|---|---|
| JP | 03060133 A | 3/1991 |
| JP | 09107011 A | 4/1997 |

* cited by examiner

Primary Examiner—Kamand Cuneo
Assistant Examiner—Paresh Patel
(74) Attorney, Agent, or Firm—Laurence A. Greenberg; Werner H. Stemer; Ralph E. Locher

(57) ABSTRACT

An electrical component contains a pad formed of an electrically conductive material. The pad serves for the application of a contact element and is complemented by an electrically conductive edge strip. The pad and the edge strip are isolated from one another. The component which includes the pad on which misalignments or deformations of contact elements which occur in a functionality test can be detected easily and directly without additional analytical devices.

13 Claims, 3 Drawing Sheets

ELECTRICAL COMPONENT WITH A CONTACT AND METHOD FOR FORMING A CONTACT ON A SEMICONDUCTOR MATERIAL

BACKGROUND OF THE INVENTION

Field of the Invention:

The invention relates to an electrical component, particularly an integrated semiconductor circuit with a contact, and a method for constructing a contact.

Semiconductor components typically contain integrated circuits that are produced by surface structuring on a semiconductor material, such as silicon or binary, tertiary or quaternary compound semiconductors, as well as contact configurations. The semiconductor material is provided in the form of thin wafers. Progressive miniaturization, whereby structure widths of less than a micrometer (sub-$\mu$m) are currently being realized, makes it possible to fabricate a plurality of integrated circuits on one wafer.

At the end of the process of fabricating the integrated circuits, the wafers are divided into individual integrated circuits and/or groups thereof. These are then packaged in electrically insulating housings and are electrically drivable by way of external contacts that are provided on the housings.

For semiconductor components, functionality tests are typically performed even during the production process after each individual step and/or after a defined number of steps. Test analyses are carried out particularly after complicated steps or after steps which experience has shown to be highly susceptible to error.

In the typical functionality tests on individual structural elements or individually deposited layers such as dopant layers, metallization layers or isolating oxide layers, electrical parameters such as voltage or current are usually measured. Comprehensive testing of the functionality of the overall circuit is also frequently carried out during the fabrication process. For testing purposes, individual memory cells of the chip may be activated and tested.

In the test operation, contact pins in the form of test pins are generally placed on the contact surfaces (pads). The test pins are connected to external probe devices or control devices with which the current-voltage dependencies which are required by the integrated circuit in the respective state of processing, or capacities of individual components such as transistors or capacitors, are tested.

Owing to the complexity of the circuit configurations, individual contact pins or test pins are not utilized for this purpose; rather, a multi-pin card in the form of a test board is utilized. In the pin card, the pin spacing is selected according to the spacing of the pads of the integrated circuit that are to be contacted.

The multiplicity of the pads that are to be contacted for test purposes, but more so their small size, demand high precision in the placement of the test pins of a multi-pin card on the surface of the semiconductor material. Successful placement of the test pins for purposes of executing a functionality test may require several passes in order to be able to guarantee the positional precision, which is time-consuming. Besides this, the tips of the pins can become slightly deformed in the placement of the test pins on the pads. As a result, the desired contact of the test pin and the pad may not exist, and on the other hand, it may be impossible to use the deformed pin for further functionality tests, so that it must be replaced.

In addition, during placement, the point of a test pin can slide beyond the edge of the pad and destroy the neighboring layers on the semiconductor surface. A pin can destroy an electrically insulating oxide layer and thus produce unwanted electrical contact. A passivation layer or other layer such as an insulating varnish layer can also be harmed by the point of a pin that has been incorrectly set on a pad. That can have long-term effects besides immediately impairing the electrical characteristics. For instance, moisture can penetrate the integrated circuit through a tear in an insulating layer that has been caused by the pin, causing the integrated circuit to no longer function according to requirements.

Heretofore, such disadvantageous damage has been detected by photo-optical examination. By photo-optical examination, damage at the margin of the pad, known as pad edge damage, can only be detected at the end of the fabrication process, and consequently the entire wafer has to be discarded when damage is discovered. In particular, with conventional photo-optical examinations, it is impossible to preventively detect pin deformations or off-center contact before they lead to surface damage.

Japanese Patent Abstract JP 09-107011a describes an aligning pad in which a central pad is surrounded by a segmented conductive edge strip, whereby all parts of the pad are grounded to a different resistance. By measuring the current, it can then be determined which part of the contact pad an alignment probe sits on.

SUMMARY OF THE INVENTION

It is accordingly an object of the invention to provide an electrical component with a contact and a method for forming a contact on a semiconductor material that overcomes the above-mentioned disadvantages of the prior art devices of this general type, on which misalignments or deformations of contact elements which occur in a functionality test can be detected easily and directly without additional analytical devices.

With the foregoing and other objects in view there is provided, in accordance with the invention, an electrical component. The electrical component contains at least one pad formed of an electrically conductive material for receiving an application of a contact element being a test pin. The pad is configured for the application of the test pin for function tests and/or for fastening a connecting wire to the pad. An electrically conductive edge strip is disposed in a region of the pad and has a terminal. The electrically conductive edge strip is electrically isolated from the pad. Evaluation logic for detecting an electrical short is connected to the terminal.

One or more pads are provided on the inventive electrical component, which is formed of an electrically conductive material and which serves for the placement of contact elements. According to the invention, each of the pads contains an electrically conductive edge strip that is isolated from the pads. The advantage herein is that misalignment or deformation of contact elements is indicated by way of an electrical contact of the edge strip and the pad.

In the context of the invention, an electrical component is, above all else, a semiconductor element on which integrated circuits are provided, which circuits have been integrated by structuring processes, for instance dynamic write/read memories including corresponding cover layers and isolation layers as well as corresponding contact tracks and terminal connections. The semiconductor component typically has a multi-layer structure formed of layers of different materials. The pad and the edge strip can be inventively deposited as the final metallization layer.

The advantage of the invention is that misalignments and deformations of contact elements can be detected before a pad is damaged, by a semi-interactive correction process. At the same time, a secondary advantage is the prevention of secondary harm that occurs when damage is not detected early or as early as possible.

In a preferred embodiment of the inventive semiconductor component, a trench is provided between the pad and the edge strip in order to isolate the pad and the edge strip. This development makes possible a simple and thus cost-effective production.

The edge strip preferably contains a terminal for evaluation logic for detecting an electrical short. A short can be detected by applying a test pin on both the contact strip and the pad. Suitable measures for repositioning the test pin can be initiated directly by the evaluation logic.

When the edge strip surrounds the pad equidistantly, such mispositioning can be detected along the entire perimeter of the pad.

A preferred segmenting of the edge strip has the added advantage that the position of a misalignment of a contact element can be precisely determined from the location of a short and can therefore be precisely corrected.

In accordance with an added feature of the invention, an electrically isolating intermediate layer is disposed between the pad and the electrically conductive edge strip.

According to the invention, the pad can also be part of a test structure. The test structure can also be integrated in the semiconductor device. It is also imaginable for the evaluation logic to be integrated in the semiconductor device at least to the greatest possible extent.

In a particularly preferred embodiment, the contact element is a test pin and/or a connecting wire. The test pin can be placed on the pad for a functionality test. But the pad can also be configured so that a connecting wire that is constructed as a bond wire is connected to it. The quality of the bond connections can thereby be tested with the inventive contact configuration by the evaluating logic.

In the inventive method for forming a contact from an electrically conductive material on a semiconductor material that is provided with at least one integrated circuit, the contact is generated such that it is suitable for the application of a contact element. The contact is so deposited on the semiconductor material as a two-piece contact with a pad and an adjoining edge strip formed of an electrically conductive material, respectively, that the two contact portions are electrically isolated from one another. The edge strip is preferably deposited surrounding the inner contact portion. That leads to the advantageous aligning of the masks or mask structures that are required to the deposition.

Particular advantage is gained by the incorporation of a trench into a layer bearing the two contact portions between the pad and the edge strip. The advantage of the inventive technique is that the two contact portions can then be applied in one processing step by deposition or evaporation coating.

Other features which are considered as characteristic for the invention are set forth in the appended claims.

Although the invention is illustrated and described herein as embodied in an electrical component with a contact and a method for forming a contact on a semiconductor material, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
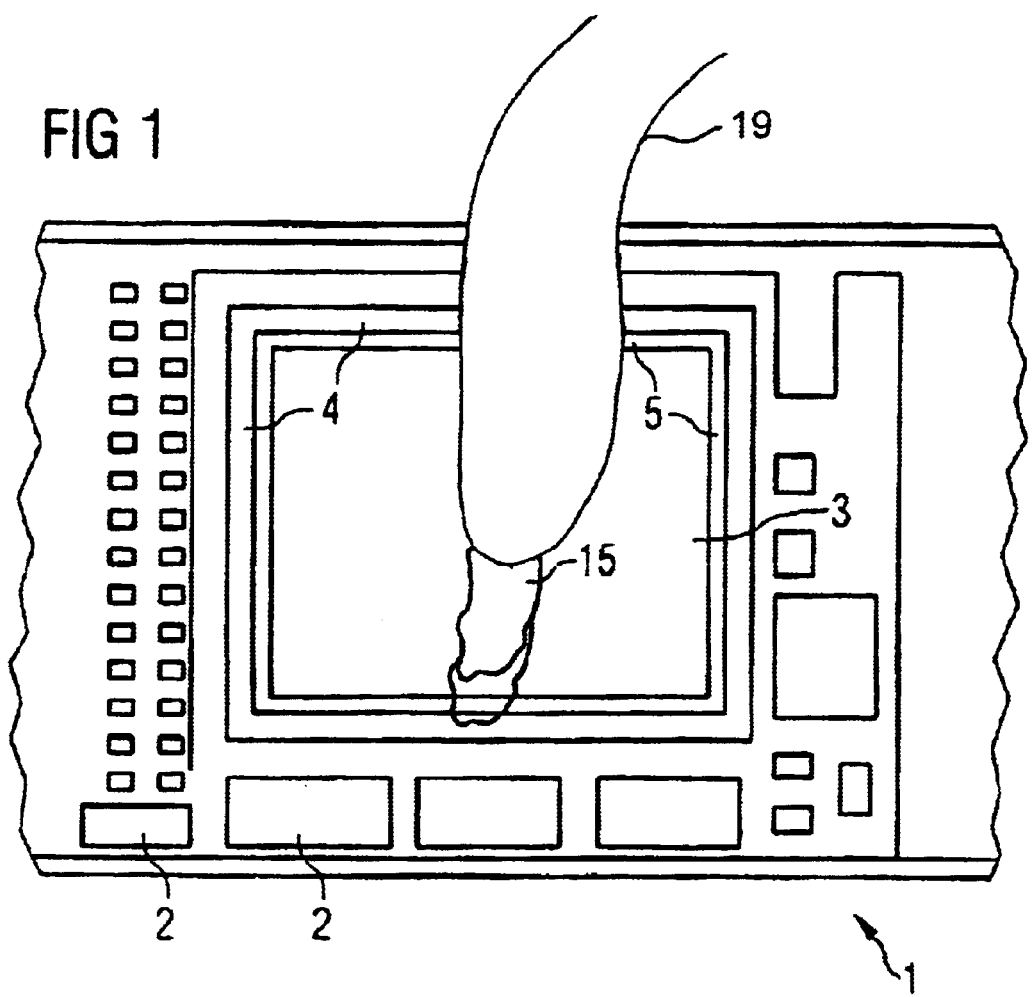
FIG. 1 is a diagrammatic, enlarged plan view of an inventive embodiment of a pad with an edge strip, which pad has been damaged by an application of a test pin.

Referring to the now figures of the drawing in detail and first, particularly, to FIG. 1 thereof, there is shown a semiconductor component 1, represented sectionally in FIG. 1, in the form of a wafer that has been formed from a semiconductor material with integrated circuits formed thereon. The semiconductor component 1 has a pad 3 in addition to electronic elements 2 of the integrated circuits. The pad 3, represented in plan view, is formed of a metal, preferably aluminum. The pad 3 revealed by the structured side of the wafer serves as an external contact following the fabrication of the integrated circuits and the packaging of the circuits in a housing with additional connections.

To that end, wired connections 19 in the form of bond connections are typically formed from individual integrated circuits or groups of integrated circuits to the pad 3. The wires of the bond connections 19 are installed in the center of the pad 3 and fixed in place. According to FIG. 1, the preferably square pad 3 is surrounded in an isolating fashion by a closed edge strip 4 that is formed from an electrically conductive material, preferably metal. According to FIG. 2, an electrically isolating trench 5, preferably of uniform width, is located between the edge strip 4 and the pad 3. The trench 5 is formed in the semiconductor material 40 (FIG. 2).

Figure 2:
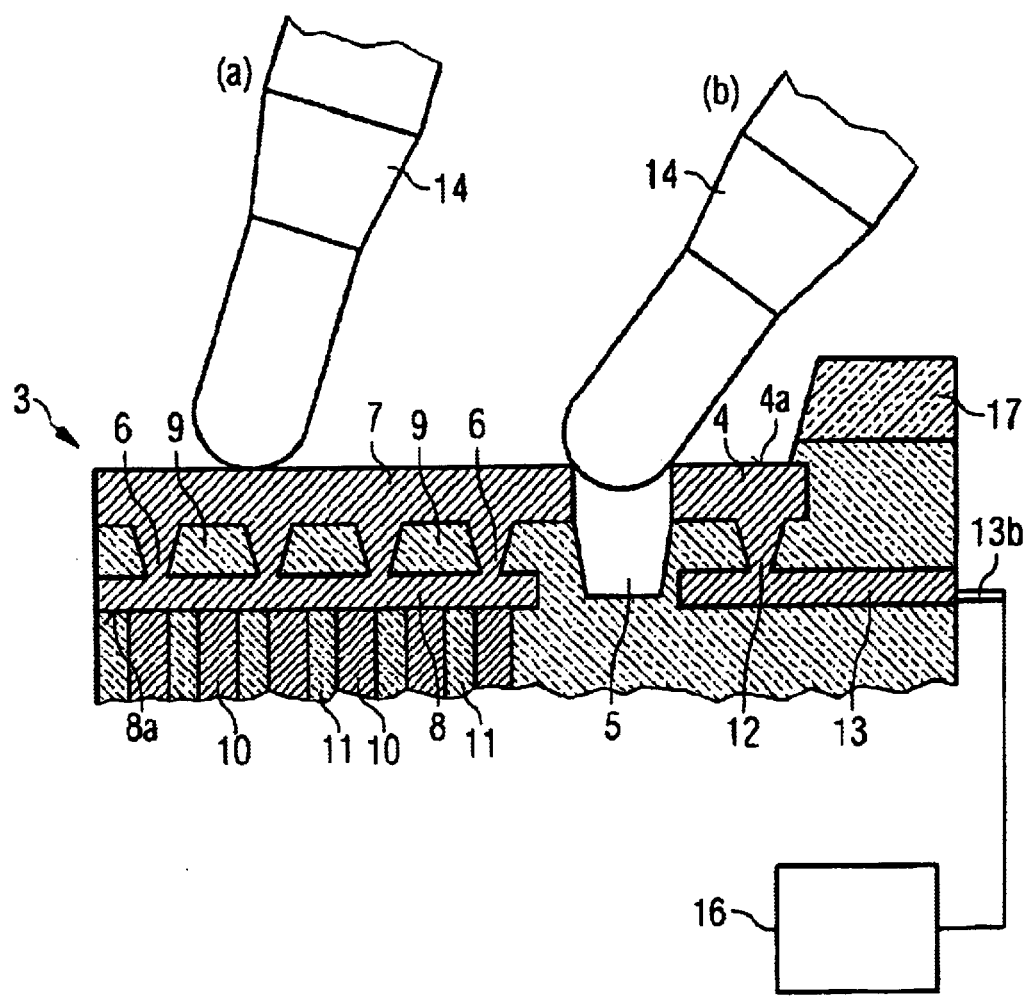
FIG. 2 is a simplified, sectional view through the inventive semiconductor device in a region of the pad.

According to FIG. 2, the pad 3 advantageously contains two metallization layers 7, 8, which are preferably conductively connected by ridges 6. Insulating material 9, preferably an oxide, is located between the ridges 6 and layers 7, 8. Terminal ridges 10 which are formed from a semiconductor material are led away at a right angle on a bottom side 8a of the bottom layer 8. Ridges 11 which are formed from a dielectric material are located between the terminal ridges 10.

According to FIG. 2, the pad 3 is separated from the edge strip 4 by the trench 5 that leads from the surface down into the interior of the semiconductor material in a tapering fashion. A side of a conical connecting ridge 12 opposite a clear surface 4a of the edge strip 4 is led away at a right angle. The connecting ridge 12 connects the edge strip 4 to a conductive layer 13 that is substantially parallel to the edge strip 4. The edge strip 4, the connecting ridge 12, and the conductive layer 13 are preferably fabricated from the same material. An imide layer 17 adjoins the edge strip 4 for passivation.

In a functionality test of the finished integrated circuit and its intermediate stages, a point of a test pin 14 of a pin card is set onto the pad 3 as represented in FIG. 2. Electrical quantities such as current, voltage and/or capacity are measured by use of the pin card in connection with evaluation electronics 16, in order to collect information about the proper functioning of the partly or completely finished integrated circuit.

As a result of misalignment of the pin card and/or incorrect application of the point of the pin 14, the point may not be placed in the center of the pad 3. During application, the pin tip slides across the pad 3 in a grazing fashion 15, as represented in FIG. 1. The pin tip can scratch material out of the pad 3 and deposit it at the end of the scratch. Such a material deposit formed by a grazing application of a pin tip is indicated by reference character 15 in FIG. 1.

In FIG. 1, the material has also bridged the trench 5 and been deposited beyond the pad 3 on the edge strip 4. The edge strip 4 and the pad 3 are thus conductively connected. According to the invention, an electrical connection between the pad 3 and the edge strip 4 in the form a short circuit can be detected by evaluation logic 16, which is conductively connected to the conductive layer 13 across its terminal 13b and to the pad 3 across the metallization layer 8, as represented as in FIG. 2. If the evaluation logic 16, which can be configured as a simple circuit or can be computer-controlled, and which can be disposed in the semiconductor component 1 itself or externally, detects such a short, the process engineer is signaled that an error has occurred in the placement of the pin or pin card.

Besides additional electrical examinations, an optical inspection can be performed by the evaluation logic 16 in order to determine the cause of the short. According to the invention, particular importance is attached to whether the short was caused by a removable short-generating connection, or beyond that, irreparable damage, known as pad edge damage, has been done to the pad 3.

Insofar as, consistent with FIG. 1, the transferred material has not been carried beyond the edge strip 4 into other parts or sublayers of the semiconductor device that surround the edge strip, and the passivation layer 17 has not been damaged as a result, it is assumed that the functionality and reliability of the semiconductor device have not been substantially impaired.

A misplacement of the pin tip can already be inventively detected approximately at the edge of the pad 3. As represented by an applied pin 14 in FIG. 2, part (b), a conductive connection can be generated between the pad 3 and the edge strip 4 by connectively applying the pin to both the pad 3 and the edge strip 4. A short can be detected by the evaluation logic 16 in this case as well. The control of the pin card, or more precisely the pins and pin tips, is then directly accessed. The pin card is first lifted off of the semiconductor material in order to achieve better positioning.

If, upon the raising of the pin card from the pad 3 or edge strip 4, the evaluation logic 16 ascertains that there is no longer an electrical short between the edge strip 4 and the pad 3, the pin 14 is moved in the direction of the center of the pad 3 by position sensing, which is typically executed by a process computer, and another attempt is made to lower the pin 14 onto the pad 3. If an electrical short is not detected by the evaluation logic 16 upon the re-lowering of the pin 14 onto the pad 3, it must be presumed that the pin position is correct, as represented in FIG. 2, part (a). The functionality test can then be begun in the last unit of the integrated circuit to have been generated.

The invention is not limited to the described exemplifying embodiment, which can be modified in many ways. The functioning of the evaluation logic 16 can be tuned to the simultaneous lowering of a large number of pins 14 onto an equal number of pads 3. The logic evaluation 16 can detect whether there is an electrical short only at one pad 3 or at several pads 3. Accordingly, the pin card can be lifted all at once. But a correction of the position of just one pin 14(b) that is responsible for a short is also imaginable.

It is also possible, by use of position information of the individual pads 3, to provide these with a relevance factor with respect to the testing functionality of the integrated circuit. If a short on a pad with high priority with respect to the test of the integrated circuit is detected by the evaluation logic 16 upon the application of a pin card, then a repositioning of the pin card must be performed without exception. On the other hand, if the evaluation logic 16 detects contact between the pad 3 and the surrounding edge strip 4, and the pad 3 is not very relevant with respect to the functionality testing of the integrated circuit, then the functionality test can be continued. In that case, the pin card does not have to be repositioned. Furthermore, in that case, the pad 3 for which a short was reported can be retested in one of the subsequent functionality tests.

It goes without saying that the inventive scope can contain a separation between the pad 3 and the surrounding edge strip 4 by other than the trench represented in the figures. For example, it is imaginable that there be an isolating material 41 (see FIG. 3A), such as a photosensitive resist and/or an oxide layer which grows on a semiconductor surface naturally, deposited between the pad 3 and the edge strip 4. What is critical to the invention is that the placing of a pin formed of a conductive material both on the pad and on the edge strip is able to generate an electrical current flow signal between the two.

Figure 3A:
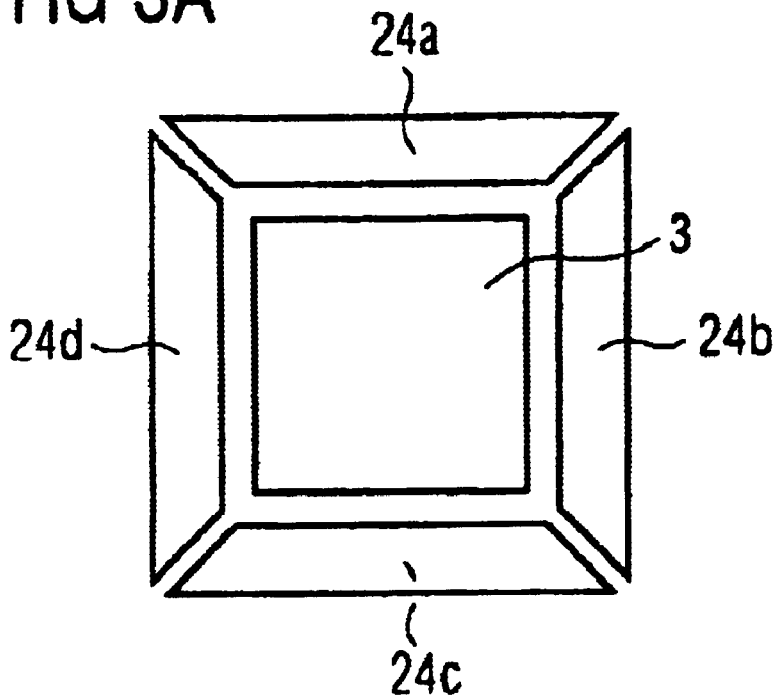
FIGS. 3A and 3B are plan views of two additional inventive embodiments of the pad with the edge strip.
Figure 3B:
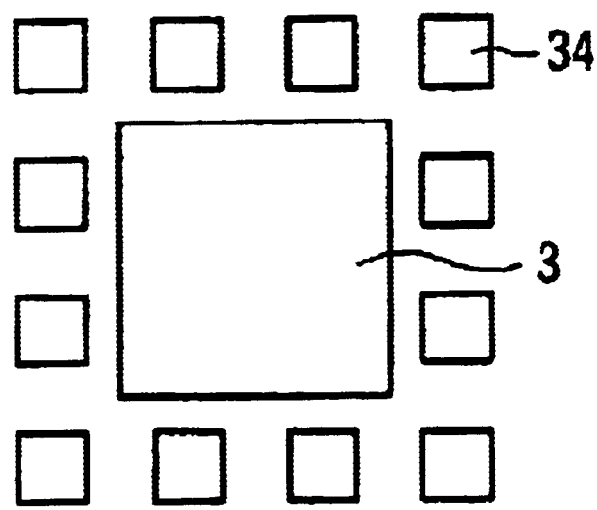

The edge strip 4 need not surround the pad completely. When the test pin can be moved beyond the pad 3 only in one direction, the edge strip 4 can be constructed in the corresponding edge portion only. The surrounding edge strip can also be segmented as indicated in FIG. 3A and FIG. 3B. In FIG. 3A, an edge strip that surrounds the pad 3 is partitioned into four segments 24a, 24b, 24c, 24d, each of which is disposed on one side of the pad, respectively. FIG. 3B represents an edge strip configuration of 12 edge strip blocks 34 distributed around the pad 3. Segmenting of the edge strip is advantageous, in that the position of a misalignment of a contact element can be precisely determined from the position of a short and thus precisely corrected.

The trench 5 can be inventively generated by various processing techniques in semiconductor technology. Subject to the corresponding requirements with respect to the width and depth of the trench, various methods of deposition can be selected, such as reactive ion etching, wet chemical etching, or other common deposition methods in photolithography or X-ray lithography.

Nor is the invention limited to the detection of an incorrect placement of a pin of a conventional pin card such as what is known as a cantilever card. Rather, given adjustment to varying size relations, the detection of the incorrect placement of a further developed, for instance lithographically fabricated, probe card is possible by the invention.

Lastly, the individual features of the invention can obviously also be utilized in combinations other than those herein represented and described.

We claim:

1. An electrical component, comprising:
    at least one pad formed of an electrically conductive material for receiving an application of a contact element being a test pin, said pad configured for at least one of the application of the test pin for function tests and for fastening a connecting wire to said pad;

an electrically conductive edge strip disposed in a region of said pad and having a terminal, said electrically conductive edge strip being electrically isolated from said pad; and evaluation logic connected to said terminal for detecting a possible electrical short between said pad and said electrically conductive edge strip.

2. The component according to claim 1, wherein said pad is surrounded by said electrically conductive edge strip without being touched by said electrically conductive edge strip.

3. The component according to claim 2, wherein said electrically conductive edge strip is segmented.

4. The component according to claim 1, further comprising a semiconductor material having a trench formed therein, said trench disposed between said pad and said electrically conductive edge strip.

5. The component according to claim 1, further comprising an electrically isolating intermediate layer disposed between said pad and said electrically conductive edge strip.

6. The component according to claim 1, wherein said pad is part of a test structure.

7. The component according to claim 1, wherein the electrical component is an integrated semiconductor circuit.

8. A method for constructing a contact formed of an electrically conductive material on a semiconductor material having at least one electrical circuit, which comprises the steps of:

providing the semiconductor material with the electrical circuit;

constructing a pad for receiving an application of a contact element being a test pin on the semiconductor material, the pad configured for at least one of receiving the application of the test pin for function tests and for fastening a connecting wire; and depositing an electrically conductive edge strip on the semiconductor material in a region of the pad, the pad and the electrically conductive edge strip being electrically isolated from one another, the electrically conductive edge strip having a terminal connected to an evaluation logic for detecting a possible electrical short between the pad and the electrically conductive edge strip.

9. The method according to claim 8, which further comprises forming the electrically conductive edge strip to surround the pad.

10. The method according to claim 9, which further comprises forming the electrically conductive edge strip in a segmented manner.

11. The method according to claims 8, which further comprises forming a trench in the semiconductor material between the pad and the electrically conductive edge strip.

12. The method according to claim 8, which further comprises disposing an electrically isolating intermediate layer between the pad and the electrically conductive edge strip.

13. The method according to claim 8, which further comprises depositing the pad and the electrically conductive edge strip in a course of constructing a topmost metallization layer.

* * * * *